US011227657B2

(12) United States Patent
Lee

(10) Patent No.: US 11,227,657 B2
(45) Date of Patent: *Jan. 18, 2022

(54) SEMICONDUCTOR DEVICE AND OPERATING METHOD OF THE SEMICONDUCTOR DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/020,342

(22) Filed: Sep. 14, 2020

(65) Prior Publication Data

US 2020/0411101 A1    Dec. 31, 2020

Related U.S. Application Data

(63) Continuation of application No. 16/437,303, filed on Jun. 11, 2019, now Pat. No. 10,803,951.

(30) Foreign Application Priority Data

Oct. 22, 2018    (KR) .......................... 10-2018-0126291

(51) Int. Cl.
G11C 7/00      (2006.01)
G11C 7/22      (2006.01)
G11C 16/08     (2006.01)
G11C 16/26     (2006.01)
G11C 16/10     (2006.01)

(52) U.S. Cl.
CPC .............. *G11C 16/08* (2013.01); *G11C 16/10* (2013.01); *G11C 16/26* (2013.01)

(58) Field of Classification Search
CPC .......... G11C 16/08; G11C 16/10; G11C 16/26
See application file for complete search history.

(56) References Cited

U.S. PATENT DOCUMENTS

| | | | |
|---|---|---|---|
| 10,803,951 B2 * | 10/2020 | Lee .................... | G11C 16/3459 |
| 2011/0292725 A1 | 12/2011 | Choi et al. | |
| 2013/0188426 A1 * | 7/2013 | Park .................... | G11C 16/3427 |
| | | | 365/185.22 |
| 2015/0095558 A1 | 4/2015 | Kim et al. | |

(Continued)

FOREIGN PATENT DOCUMENTS

| KR | 1020110001102 A | 1/2011 |
|---|---|---|
| KR | 101075505 B1 | 10/2011 |
| KR | 1020160135055 A | 11/2016 |

*Primary Examiner* — Toan K Le
(74) *Attorney, Agent, or Firm* — William Park & Associates Ltd.

(57)    ABSTRACT

A method of operating a semiconductor device, the semiconductor device includes: a memory block including a plurality of word lines; and a control logic for performing a first program operation on first memory cells corresponding to a first word line among the plurality of word lines, performing the first program operation on second memory cells corresponding to a second word line adjacent to the first word line, performing a second program operation on the first memory cells, performing a dummy program operation on third memory cells corresponding to a third word line adjacent to the second word line, and performing the second program operation on the second memory cells.

11 Claims, 16 Drawing Sheets

(56) References Cited

U.S. PATENT DOCUMENTS

| | | | |
|---|---|---|---|
| 2015/0103599 A1* | 4/2015 | Kim | G11C 16/26 |
| | | | 365/185.12 |
| 2015/0117100 A1 | 4/2015 | Park et al. | |
| 2016/0210083 A1 | 7/2016 | Oh et al. | |
| 2016/0284397 A1* | 9/2016 | Kim | G11C 11/5642 |
| 2020/0065026 A1 | 2/2020 | Kang et al. | |

* cited by examiner

FIG. 5A

| | Page | MS11~MS1n | | Page | MS21~MS2n | | Page | MS31~MS3n | | Page | MS41~MS4n | |
|---|---|---|---|---|---|---|---|---|---|---|---|---|
| | | 1st PGM | 2nd PGM | | 1st PGM | 2nd PGM | | 1st PGM | 2nd PGM | | 1st PGM | 2nd PGM |
| WL39 | P0 | 1 | 9 | P1 | 2 | 10 | P2 | 3 | 11 | P3 | 4 | 12 |
| WL38 | P4 | 5 | 17 | P5 | 6 | 18 | P6 | 7 | 19 | P7 | 8 | 20 |
| WL37 | P8 | 13 | 25 | P9 | 14 | 26 | P10 | 15 | 27 | P11 | 16 | 28 |
| WL36 | P12 | 21 | 33 | P13 | 22 | 34 | P14 | 23 | 35 | P15 | 24 | 36 |
| WL35 | P16 | 29 | 41 | P17 | 30 | 42 | P18 | 31 | 43 | P19 | 32 | 44 |
| WL34 | P20 | 37 | 49 | P21 | 38 | 50 | P22 | 39 | 51 | P23 | 40 | 52 |
| WL33 | P24 | 45 | 57 | P25 | 46 | 58 | P26 | 47 | 59 | P27 | 48 | 60 |
| WL32 | P28 | 53 | 65 | P29 | 54 | 66 | P30 | 55 | 67 | P31 | 56 | 68 |
| WL31 | P32 | 61_Dummy | | P33 | 62_Dummy | | P34 | 63_Dummy | | P35 | 64_Dummy | |
| WL30 | P36 | unprogrammed | | P37 | unprogrammed | | P38 | unprogrammed | | P39 | unprogrammed | |
| ... | ... | | | ... | | | ... | | | ... | | |
| WL0 | P156 | | | P157 | | | P158 | | | P159 | | |

FIG. 5B

| | Page | MS11~MS1n | | | Page | MS21~MS2n | | | Page | MS31~MS3n | | | Page | MS41~MS4n | | |
|---|---|---|---|---|---|---|---|---|---|---|---|---|---|---|---|---|
| | | 1st PGM | 2nd PGM | 3rd PGM | | 1st PGM | 2nd PGM | 3rd PGM | | 1st PGM | 2nd PGM | 3rd PGM | | 1st PGM | 2nd PGM | 3rd PGM |
| WLA7 | P0 | 1 | 9 | 13 | P1 | 2 | 10 | 14 | P2 | 3 | 11 | 15 | P3 | 4 | 12 | 16 |
| WLA6 | P4 | 5 | 21 | 25 | P5 | 6 | 22 | 26 | P6 | 7 | 23 | 27 | P7 | 8 | 24 | 28 |
| WLA5 | P8 | 17 | 33 | 37 | P9 | 18 | 34 | 38 | P10 | 19 | 35 | 39 | P11 | 20 | 36 | 40 |
| WLA4 | P12 | 29 | 45 | 49 | P13 | 30 | 46 | 50 | P14 | 31 | 47 | 51 | P15 | 32 | 48 | 52 |
| WLA3 | P16 | 41 | 57 | 61 | P17 | 42 | 58 | 62 | P18 | 43 | 59 | 63 | P19 | 44 | 60 | 64 |
| WLA2 | P20 | 53 | 69 | 73 | P21 | 54 | 70 | 74 | P22 | 55 | 71 | 75 | P23 | 56 | 72 | 76 |
| WLA1 | P24 | 65 | 81 | 85 | P25 | 66 | 82 | 86 | P26 | 67 | 83 | 87 | P27 | 68 | 84 | 88 |
| WLA0 | P28 | 77_Dummy | | | P29 | 78_Dummy | | | P30 | 79_Dummy | | | P31 | 80_Dummy | | |
| WL39 | P32 | unprogrammed | | | P33 | unprogrammed | | | P34 | unprogrammed | | | P35 | unprogrammed | | |
| ... | ... | | | | ... | | | | ... | | | | ... | | | |
| WL0 | P188 | | | | P189 | | | | P190 | | | | P191 | | | |

FIG. 7B

|  | Page | MS11~MS1n | | Page | MS21~MS2n | | Page | MS31~MS3n | | Page | MS41~MS4n | |
|---|---|---|---|---|---|---|---|---|---|---|---|---|
|  |  | 1st PGM | 2nd PGM |  | 1st PGM | 2nd PGM |  | 1st PGM | 2nd PGM |  | 1st PGM | 2nd PGM |
| WL39 | P0 | 1 |  | P1 | 2 |  | P2 | 3 |  | P3 | 4 |  |
| WL38 | P4 | 5 | 9 | P5 | 6 | 10 | P6 | 7 | 11 | P7 | 8 | 12 |
| WL37 | P8 | 13 | 17 | P9 | 14 | 18 | P10 | 15 | 19 | P11 | 16 | 20 |
| WL36 | P12 | 21 | 25 | P13 | 22 | 26 | P14 | 23 | 27 | P15 | 24 | 28 |
| WL35 | P16 | 29 | 33 | P17 | 30 | 34 | P18 | 31 | 35 | P19 | 32 | 36 |
| WL34 | P20 | 37 | 41 | P21 | 38 | 42 | P22 | 39 | 43 | P23 | 40 | 44 |
| WL33 | P24 | 45 | 49 | P25 | 46 | 50 | P26 | 47 | 51 | P27 | 48 | 52 |
| WL32 | P28 | 61 | 53 | P29 | 62 | 54 | P30 | 63 | 55 | P31 | 64 | 56 |
| WL31 | P32 | 57 Dummy | 65 | P33 | 58 Dummy | 66 | P34 | 59 Dummy | 67 | P35 | 60 Dummy | 68 |
| WL30 | P36 | unprogrammed | | P37 | unprogrammed | | P38 | unprogrammed | | P39 | unprogrammed | |
| ... |  |  |  |  |  |  |  |  |  |  |  |  |
| WL0 | P156 |  |  | P157 |  |  | P158 |  |  | P159 |  |  |

| | Page | MS11~MS1n | | Page | MS21~MS2n | | Page | MS31~MS3n | | Page | MS41~MS4n | |
| | | 1st PGM | 2nd PGM | | 1st PGM | 2nd PGM | | 1st PGM | 2nd PGM | | 1st PGM | 2nd PGM |
|---|---|---|---|---|---|---|---|---|---|---|---|---|
| WLk | P0 | 5 | 9 | P1 | 6 | 10 | P2 | 7 | 11 | P3 | 8 | 12 |
| WLk+1 | P4 | 1_Dummy | | P5 | 2_Dummy | | P6 | 3_Dummy | | P7 | 4_Dummy | |

FIG. 9B

| BLk | WL1 ⋮ WLc | programmed |
| | WLc+1 ⋮ WLk | dummy programmed → skip |
| | WLk+1 ⋮ WLy | |

FIG. 9C

| BLk | WL1 ⋮ WLc | programmed |
| | WLc+1 ⋮ WLk | dummy programmed → skip |
| | WLk+1 ⋮ WLk+s | unprogrammed → skip |
| | WLk+s+1 ⋮ WLy | |

SEMICONDUCTOR DEVICE AND OPERATING METHOD OF THE SEMICONDUCTOR DEVICE

CROSS-REFERENCE TO RELATED APPLICATION

The present application is a continuation application of U.S. patent application Ser. No. 16/437,303, filed on Jun. 11, 2019, and claims priority under 35 U.S.C. § 119(a) to Korean patent application number 10-2018-0126291, filed on Oct. 22, 2018, in the Korean Intellectual Property Office, the entire disclosure of which is incorporated herein by reference.

BACKGROUND

1. Technical Field

The present disclosure generally relates to an electronic device, and more particularly, to a semiconductor device and an operating method of the semiconductor device.

2. Related Art

A semiconductor memory system is a storage device implemented using a semiconductor such as silicon (Si), germanium (Ge), gallium arsenide (GaAs), or indium phosphide (InP). The semiconductor memory system may be generally classified into a volatile memory device and a nonvolatile memory device.

The volatile memory device is a memory device in which stored data disappears when the supply of power is interrupted. Examples of the volatile memory device include a Static Random Access Memory (SRAM), a Dynamic RAM (DRAM), a Synchronous DRAM (SDRAM), and the like. The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally classified into a NOR type flash memory and a NAND type flash memory.

SUMMARY

According to an embodiment of the present disclosure, there is provided a method for operating a semiconductor device, the method including: performing a first program operation on first memory cells corresponding to a first word line; performing the first program operation on second memory cells corresponding to a second word line adjacent to the first word line; performing a second program operation on the first memory cells; performing a dummy program operation on third memory cells corresponding to a third word line adjacent to the second word line; and performing the second program operation on the second memory cells.

According to an embodiment of the present disclosure, there is provided a semiconductor device including: a memory block including a plurality of word lines; and a control logic configured to perform a first program operation on first memory cells corresponding to a first word line among the plurality of word lines, perform the first program operation on second memory cells corresponding to a second word line adjacent to the first word line, perform a second program operation on the first memory cells, perform a dummy program operation on third memory cells corresponding to a third word line adjacent to the second word line, and perform the second program operation on the second memory cells.

According to an embodiment of the present disclosure, there is provided a method for operating a semiconductor device including a memory block including a plurality of word lines, the method including: performing a dummy program operation on memory cells corresponding to a word line adjacent to a closing word line among the plurality of word lines; and after the dummy program operation is performed, performing a program operation on memory cells corresponding to the closing word line.

According to an embodiment of the present disclosure, there is provided a semiconductor device including: a memory block including a plurality of word lines; and a control logic configured to perform a dummy program operation on memory cells corresponding to a word line adjacent to a closing word line among the plurality of word lines, and perform a program operation on memory cells corresponding to the closing word line after the dummy program operation is performed.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A and 5B are diagrams illustrating a program order of word lines/pages included in one memory block.

FIG. 7B is a diagram illustrating a program order of word lines/pages included in one memory block.

FIGS. 9B and 9C are diagrams illustrating a program state of word lines included in one memory block.

DETAILED DESCRIPTION

Hereinafter, embodiments according to the present disclosure will be described with reference to the accompanying drawings. In the following description, it should be noted that only a portion required to understand the operation according to the present disclosure will be described, and the description of the remaining portion will be omitted not to obscure the gist of the present disclosure. The present disclosure may, however, be embodied in different forms and should not be construed as being limited to the embodiments set forth herein. Rather, these embodiments are provided to describe the present disclosure to the extent that those skilled in the art to which the disclosure pertains may easily enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Embodiments may provide a semiconductor device having an increased operating speed and improved reliability, and an operating method of the semiconductor device.

Figure 1:
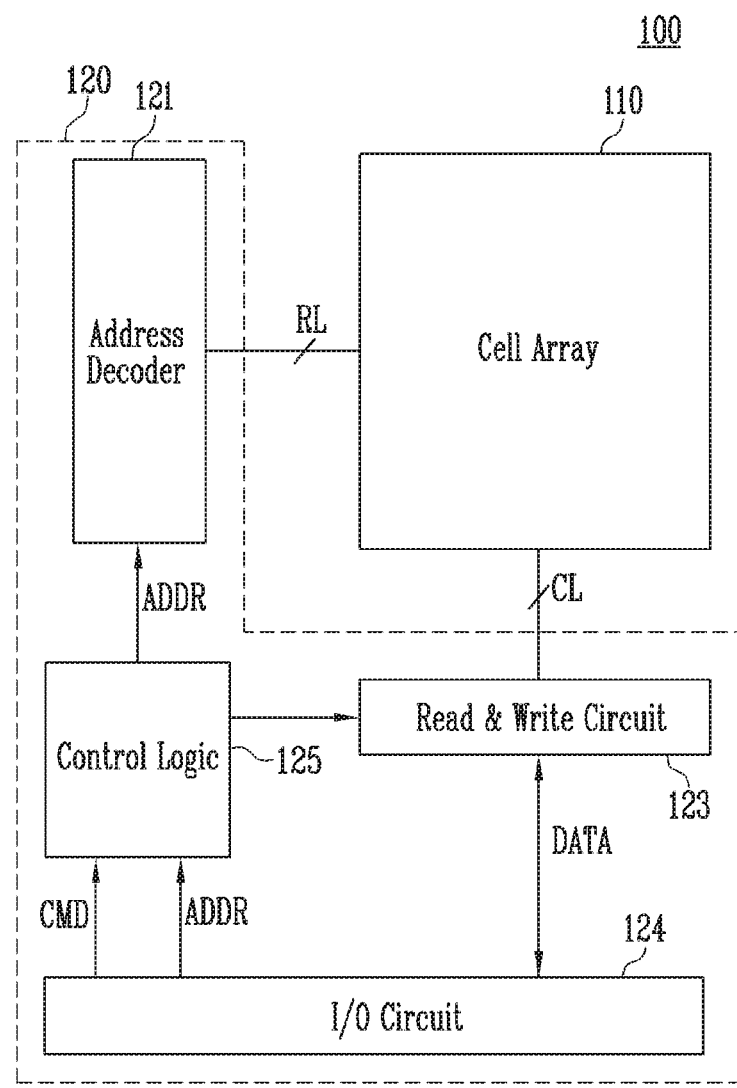
FIG. 1 is a block diagram illustrating a configuration of a semiconductor device according to an embodiment of the present disclosure.

FIG. 1 is a block diagram illustrating a configuration of a semiconductor device according to an embodiment of the present disclosure.

Referring to FIG. 1, the semiconductor device 100 includes a cell array 110 and a peripheral circuit 120.

The cell array 110 is coupled to an address decoder 121 through row lines RL, and is coupled to a read & write circuit 123 through column lines CL. The row lines RL may be word lines, and the column lines CL may be bit lines. However, the word lines and the bit lines are relative concepts. The row lines may be bit lines and the column lines may be word lines.

The cell array 110 includes a plurality of memory strings, and the memory strings may be arranged in a horizontal direction or vertical direction on a substrate. Also, the cell array 110 includes a plurality of memory blocks, and each of the memory blocks includes a plurality of pages. For example, the semiconductor device 100 performs an erase operation in units of memory blocks, and performs a program operation or read operation in units of pages.

The peripheral circuit 120 may include the address decoder 121, the read & write circuit 123, an input/output (I/O) circuit 124, and a control logic 125.

The control logic 125 may be coupled to the address decoder 121, the read & write circuit 123, and the I/O circuit 124. The control logic 125 may receive a command CMD and an address ADDR from the I/O circuit 124, and control the address decoder 121 and the read & write circuit 123 to perform an internal operation according to the received command CMD.

The address decoder 121 may be coupled to the cell array 110 through the row lines RL. For example, the address decoder 121 may be coupled to the cell array 110 through a word line, a source select line, and a drain select line. Also, the address decoder 121 may be configured to control the row lines RL under the control of the control logic 125. Therefore, the address decoder 121 may receive an address ADDR from the control logic 125, and select any one of the memory blocks of the cell array 110 according to the received address ADDR.

Program and read operations of the semiconductor device 100 may be performed in units of pages. Therefore, in the program and read operations, the address ADDR may include a block address and a row address. The address decoder 121 may decode the block address in the received address ADDR, and select one memory block according to the decoded block address. The address decoder 121 may decode the row address in the received address ADDR, and select any one page of the selected memory block according to the decoded row address.

An erase operation of the semiconductor device 100 may be performed in units of memory blocks. Therefore, in the erase operation, the address ADDR includes a block address. The address decoder 121 may decode the block address and select one memory block according to the decoded block address.

The read & write circuit 123 is coupled to the memory cell array 110 through the column lines CL. In a program operation, the read & write circuit 123 transfers data DATA received from the I/O circuit 124 to the column lines CL, and memory cells of a selected page are programmed according to the transferred data DATA. The data DATA may be multi-bit data to be respectively programmed in the memory cells. In a read operation, the read & write circuit 123 reads data DATA from memory cells of a selected page through the column lines CL, and outputs the read data DATA to the I/O circuit 124. In an erase operation, the read & write circuit 123 may float the column lines CL. A verify operation may be included in the program operation and the erase operation. The verify operation may be performed in a manner similar to that of the read operation.

According to the above-described configuration, the control logic 125 may control the semiconductor device 100 to program the memory cells, using a Single Level Cell (SLC) scheme or Multi Level Cell (MLC) scheme. In addition, the control logic 125 may control the semiconductor device 100 to perform a program operation, using a multi-step scheme. The multi-step scheme is a scheme in which a program operation is performed plural times so as to implement a target program state. The multi-step scheme may include a pre-/main-program scheme, a reprogram scheme, a shadow program scheme, and the like.

The control logic 125 may control the semiconductor device 100 to perform a dummy program operation on memory cells corresponding to a word line adjacent to a closing word line before a program operation is performed on memory cells corresponding to the closing word line. The closing word line may be a last word line on which a program operation is performed when a program operation is performed on only memory cells corresponding to some word lines among a plurality of word lines included in a memory block. That is, the closing word line may be a word line on which the program operation is lastly performed in an open block.

For example, when data to be respectively programmed in memory cells are input to the read & write circuit 123 from the I/O circuit 124, the control logic 125 may control the address decoder 121 and the read & write circuit 123 to perform a first program operation on memory cells corresponding to a closing word line, perform a dummy program operation on memory cells coupled to a word line adjacent to the closing word line, and then perform a second program operation on the memory cells corresponding to the closing word line.

In a program operation on an open block, the control logic 125 may control the semiconductor device 100 to perform a program operation on open word lines among a plurality of word lines. Also, in the program operation on the open block, the control logic 125 may control the semiconductor device 100 to skip word lines adjacent to a closing word line and perform a program operation on the other open word lines.

According to this control method, data stored in memory cells corresponding to a closing word line can be prevented from being damaged, and data retention characteristics can be ensured.

Figure 2A:
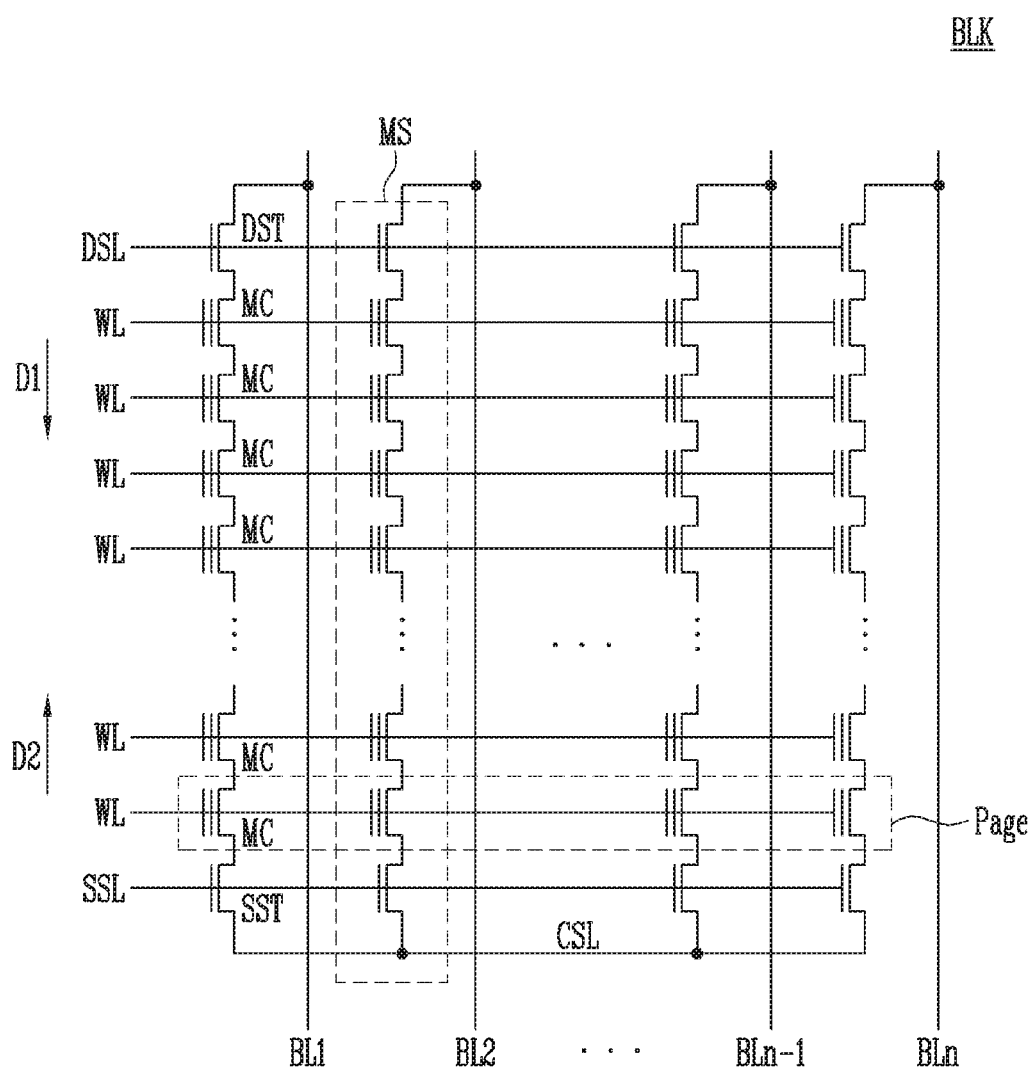
FIGS. 2A to 2C are circuit diagrams illustrating a cell array structure of the semiconductor device according to an embodiment of the present disclosure.
Figure 2B:
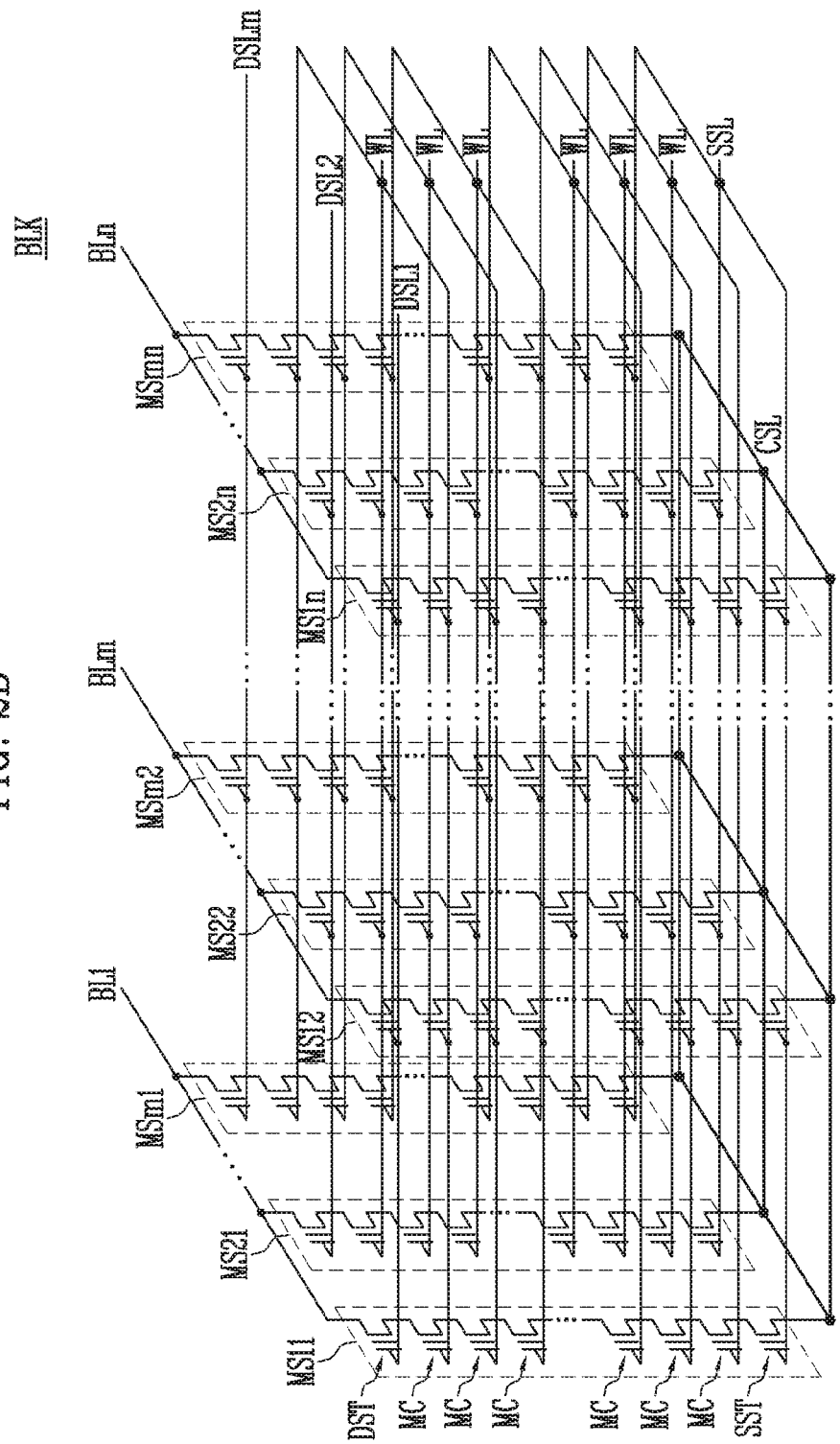
Figure 2C:
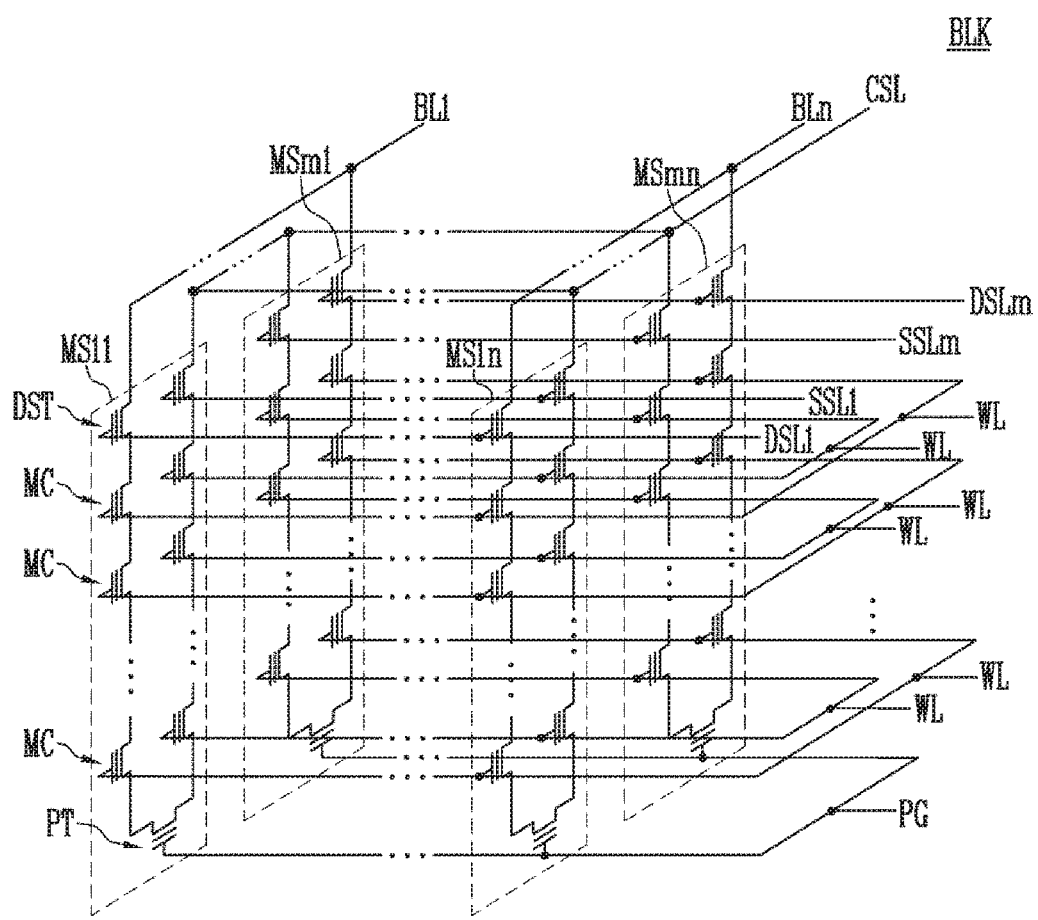

FIGS. 2A to 2C are circuit diagrams illustrating a cell array structure of the semiconductor device according to an embodiment of the present disclosure.

FIG. 2A illustrates an embodiment in which memory strings MS are two-dimensionally arranged. Referring to FIG. 2A, a memory block BLK includes a plurality of memory strings MS, and the plurality of memory strings MS are coupled between bit lines BL1 to BLn and a common source line CSL. Each of the memory strings MS includes at least one drain select transistor DST, a plurality of memory cells MC, and at least one source select transistor SST, which are coupled in series. Here, n is an integer of 2 or more.

Gate electrodes of the memory cells MC are coupled to word lines WL. Word line voltages (e.g., a program voltage, a pass voltage, a read voltage, and the like) necessary for driving may be applied to each of the word lines WL. Gate electrodes of the drain select transistors DST are coupled to a drain select line DSL. Gate electrodes of the source select transistors SST are coupled to a source select line SSL.

According to the above-described structure, memory cells MC coupled to the same word line WL to be simultaneously programmed may constitute one page, and one memory block BLK may include a plurality of pages. The plurality of pages included in the one memory block BLK may be sequentially or randomly programmed according to the arrangement order of the word lines WL. For example, the word lines WL may be sequentially selected in a first direction D1 toward a source side from a drain side, or be sequentially selected in a second direction D2 toward the drain side from the source side.

FIG. 2B illustrates an embodiment in which memory strings MS are three-dimensionally arranged. Referring to FIG. 2B, a plurality of memory strings MS11 to MSmn are coupled between bit lines BL1 to BLn and a common source line CSL. Each of the memory strings MS11 to MSmn includes at least one drain select transistor DST, a plurality of memory cells MC, and at least one source select transistor SST, which are coupled in series. Here, m and n are integers of 2 or more.

Gate electrodes of the memory cells MC are coupled to word lines WL. The memory cells MC of the memory strings MS11 to MSmn may share the word lines WL. Gate electrodes of the drain select transistors DST are coupled to drain select lines DSL1 to DSLm. For example, the drain select transistors DST of memory strings MS11 to MS1*n* may be controlled by a first drain select line DSL1, the drain select transistors DST of memory strings MS21 to MS2*n* may be controlled by a second drain select line DSL2, and the drain select transistors DST of memory strings MSm1 to MSmn may be controlled by an mth drain select line DSLm. Gate electrodes of the source select transistors SST may be coupled to a source select line SSL. The source select transistors SST may be controlled by at least one source select line SSL.

The memory strings MS11 to MSmn may be coupled to the bit lines BL1 to BLn, Memory strings MS11 to MSm1 are coupled to a first bit line BL1, and couplings between the memory strings MS11 to MSm1 and the first bit line BL1 are controlled by first to mth drain select lines DSL1 to DSLm, respectively. Memory strings MS12 to MSm2 are coupled to a second bit line BL2, and couplings between the memory strings MS12 to MSm2 and the second bit line BL2 are controlled by the first to mth drain select lines DSL1 to DSLm, respectively. In addition, memory strings MS1*n* to MSmn are coupled to an nth bit line BLn, and coupling between the memory strings MS1*n* to MSmn and the nth bit line BLn are controlled by the first to mth drain select lines DSL1 to DSLm, respectively.

The memory strings MS11 to MSmn may be commonly coupled to the common source line CSL. In addition, the source select line SSL may control couplings between the memory strings MS11 to MSmn and the common source line CSL.

According to the above-described structure, memory cells MC coupled to the same word line WL among the memory cells MC included in the memory strings MS11 to MS1*n* constitute one page, memory cells MC coupled to the same word line among the memory cells included in the memory strings MS21 to MS2*n* constitute one page, and memory cells MC coupled to the same word line WL among the memory cells MC included in the memory strings MSm1 to MSmn constitute one page. Therefore, m pages may be located at the same level, and one word line WL may be coupled to the m pages.

The number of memory strings coupled to one of the bit lines BL1 to BLn may be variously modified. In addition, the number of pages located at the same level, i.e., the number of pages coupled to one word line WL may be variously modified.

FIG. 2C illustrates an embodiment in which memory strings MS are three-dimensionally arranged. Referring to FIG. 2C, each of memory strings MS11 to MSmn includes at least one source select transistor SST, a plurality of memory cells MC, a pipe transistor PT, a plurality of memory cells MC, and at least one drain select transistor DST. A gate of the pipe transistor PT is coupled to a pipe gate PG. In addition, each of memory strings MS11 to MS22 may be arranged in a U shape. Except this, the structure of FIG. 2C is substantially identical to that described with reference to FIG. 2B, and therefore, overlapping descriptions will be omitted.

Figure 3:
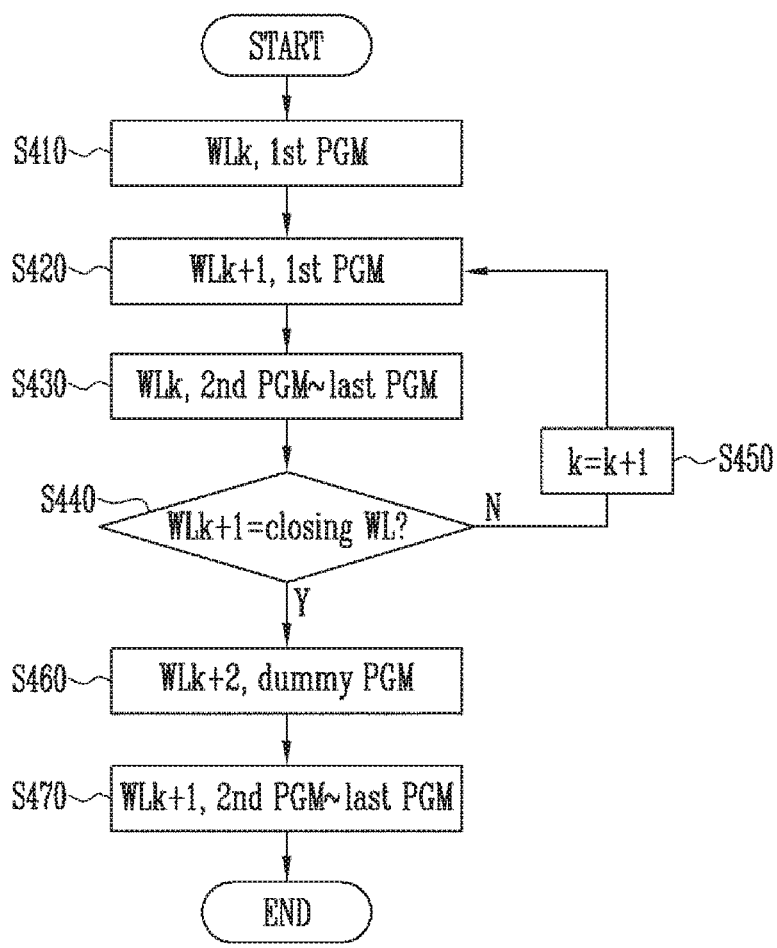
FIG. 3 is a flowchart illustrating an operating method of the semiconductor device according to an embodiment of the present disclosure.
Figure 4A:
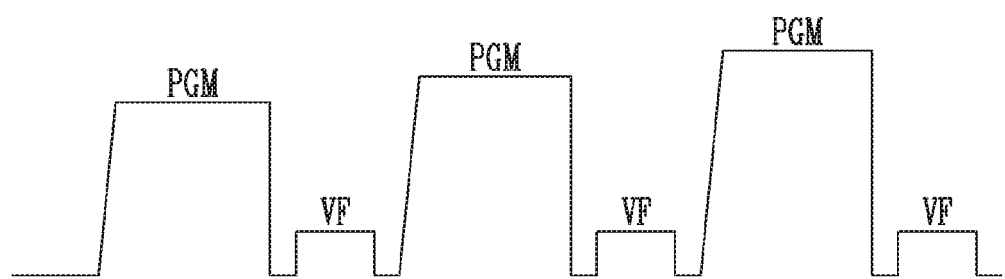
FIGS. 4A and 4B are diagrams illustrating a waveform diagram of a pulse used in a program operation.
Figure 4B:
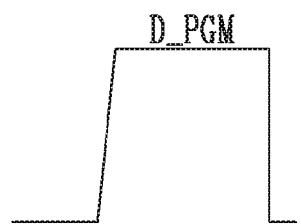

FIG. 3 is a flowchart illustrating an operating method of the semiconductor device according to an embodiment of the present disclosure, FIGS. 4A and 4B are diagrams illustrating a waveform diagram of a pulse used in a program operation, and FIGS. 5A and 5B are diagrams illustrating a program order of word lines/pages (word lines and pages) included in one memory block.

According to a method for performing a program operation, a memory block may be a closed block or open block. When a program operation on all pages included in a memory block is completed, the corresponding memory block may be referred to as a closed block. When a program operation on only some pages among pages included in a memory block is completed and is not performed on the other pages, the corresponding memory block may be referred to as an open block. For example, a program operation on only some pages among pages included in a memory block is completed and is not performed on the other pages due to a user, an external factor, etc., the corresponding memory block becomes an open block. Hereinafter, a program operation of an open block will be described.

Referring to FIG. 3, a first program operation is performed on kth memory cells corresponding to a kth word line WLk (S410). Here, k is an integer of 1 or more. The first program operation may be one of program operations of a multi-step program scheme.

The first program operation may be performed using an Incremental Step Pulse Program (ISPP) scheme. For example, the first program operation is performed by an ISPP pulse to the kth word line WLk. A program operation using the ISPP scheme may be performed in a manner that applies, to a selected word line, a program pulse PGM and a verify pulse VF between the program pulses PGM (see FIG. 4A). Therefore, according to the ISPP scheme, a program operation and a verify operation may be alternately performed.

Subsequently, the first program operation on (k+1)th memory cells corresponding to a (k+1)th word line WLk+1 (S420). The (k+1)th word line WLk+1 may be a word line adjacent to the kth word line WLk. According to a program order, the (k+1)th word line WLk+1 may be located at a level higher or lower than that of the kth word line WLk. For example, the first program operation is performed by applying the ISPP pulse to the kth word line WLk.

Subsequently, a second program operation is performed on the kth memory cells corresponding to the kth word line WLk (S430). The second program operation may be one of program operations of the multi-step program scheme. Also, the second program operation may be performed using the ISPP pulse.

In an example, the first program operation may be used to pre-program a memory cell to an intermediate program state, and the second program operation may be used to main-program the memory cell to a target program state. In another example, the first program operation may be used to program a memory cell to around a target state, and the second program operation may be used to reprogram the memory cell such that the threshold voltage distribution of each program state is narrowly corrected to be at the target state. In still another example, the first program operation may be used to shadow-program memory cells, and the second program operation may be used to main-program the memory cells to a target state. Accordingly, the program operation on the kth memory cells may be completed.

The program operation may be completed by performing three or more program operations. After a second program operation is performed on the kth memory cells corresponding to the kth word line WLk, the other program operations may be consecutively performed. For example, program operations may be consecutively performed from the second program operation to the last program operation.

Subsequently, it is determined whether the (k+1)th word line WLk+1 is a closing word line (S440). When the (k+1)th word line WLk+1 is not the closing word line (S440), the first program operation is performed on (k+2)th memory cells corresponding to a (k+2)th word line WLk+2 (S450, and S420). Subsequently, after the second program operation is performed on the (k+1)th memory cells corresponding to the (k+1)th word line WLk+1 (S430), it is checked whether the (k+2)th word line WLk+2 is the closing word line (S440). That is, "S420 to S450" are repeatedly performed until a corresponding word line becomes the closing word line.

When the (k+1)th word line WLk+1 is the closing word line (S440), a dummy program operation is performed (S460). The dummy program operation is to program dummy data into memory cells corresponding to the word line which is next to the closing word line. The dummy program operation may apply a dummy program pulse a number of times, which is smaller than that of the first or second program operation. For example, the dummy program operation is performed by applying the dummy program pulse to the (k+2)th word line WLk+2. In the dummy program operation, a dummy program pulse D_PGM may be applied once or plural times, and the verify operation may be omitted (see FIG. 4B). As described above, the number of pulses is limited or the verify operation is omitted, so that a program time can be shortened.

In addition, the dummy program operation may be performed on a plurality of word lines adjacent to the closing word line. For example, the dummy program operation may be performed on memory cells corresponding to (k+2)th to (k+x)th word lines. Here, x may be an integer of 3 or more.

Subsequently, the second program operation is performed on the (k+1)th memory cells corresponding to the (k+1)th word line WLk+1 (S470). The program operations may be consecutively performed from the second program operation to the last program operation. Accordingly, the program operation on a corresponding memory block is completed.

According to the above-described operating methods, the dummy program operation may be performed on a word line adjacent to the closing word line before the closing word line is programmed. Thus, the threshold voltage distribution of memory cells corresponding to the closing word line can be improved, and retention characteristics can be ensured.

Referring to FIG. 5A, a memory block may include memory strings MS11 to MSmn, and m and n may be integers of 2 or more. In this embodiment, a program order when the memory block includes first to fortieth word lines WL0 to WL39 and first to one hundred and sixtieth pages, and m=4 will be described. The first to fortieth word lines WL0 to WL39 may be sequentially arranged at the same level, and one word line may correspond to one page. Alternatively, the first to fortieth word lines WL0 to WL39 may be sequentially stacked, and one word line may be coupled to a plurality of pages, e.g., four pages. The number of word lines included in one memory block may be variously modified.

The program order of a plurality of word lines may be sequential or random. For example, a program operation may be sequentially performed in one direction on the word lines WL0 to WL39 arranged in the one direction, or be randomly performed irrespectively to the arrangement order. Alternatively, a program operation may be sequentially performed on the stacked word lines WL0 to WL39 from the top to the bottom or from the bottom to the top, or be randomly performed irrespectively to the stacking order. In this embodiment, a case where a program operation is sequentially performed according to the arrangement order or stacking order of word lines will be described.

Referring to FIGS. 3 to 5A, a first program operation is performed on kth memory cells corresponding to a kth word line WL39 (S410). The first program operation may be performed on first to fourth pages P0 to P3 located at the same level. In an embodiment, the first program operation may be performed on first to fourth pages P0 to P3 coupled to the same word line (i.e., WL39).

Subsequently, the first program operation is performed on (k+1)th memory cells corresponding to a (k+1)th word line WL38 (S420). The first program operation may be performed on a plurality of pages corresponding to the (k+1)th word line WL38. For example, the first program operation may be performed on fifth to eighth pages P4 to P7 located at the same level. In an embodiment, the first program operation may be performed on fifth to eighth pages P4 to P7 coupled to the same word line (i.e., WL38).

Subsequently, a second program operation is performed on the kth memory cells corresponding to the kth word line WL39 (S430). The second program operation may be performed on the first to fourth pages P0 to P3 corresponding to the kth word line WL39.

Subsequently, when the (k+1)th word line WL38 is not the closing word line (S440), the first program operation is performed on (k+2)th memory cells corresponding to a (k+2)th word line WL37 (S450, and S420). The first program operation may be performed on ninth to twelfth pages P8 to P11 corresponding to the (k+2)th word line WL37.

Subsequently, the second program operation is performed on the (k+1)th memory cells corresponding to the (k+1)th word line WL38 (S430). The second program operation may be performed on the fifth to eighth pages P4 to P7 corresponding to the (k+1)th word line WL38.

"S420 to S450" are repeatedly performed until a corresponding word line becomes the closing word line. When the corresponding word line becomes the closing word line, a dummy program operation is performed. The first program operation is performed on (k+1)th memory cells corresponding to a (k+1)th word line WL32 (S420), and the second program operation is performed on kth memory cells corresponding to a kth word line WL33 (S430). Subsequently, when the (k+1)th word line WL32 is the closing word line (S440), the dummy program operation is performed on (k+2)th memory cells corresponding to a (k+2)th word line WL31 (S460). The dummy program operation may be performed on thirty-third to thirty-sixth pages P32 to P35 corresponding to the (k+2)th word line WL31. Subsequently, the second program operation is performed on the (k+1)th memory cells corresponding to the (k+1)th word line WL32 (S470). The second program operation may be performed on twenty-ninth to thirty-second pages P28 to P31 corresponding to the (k+1)th word line WL32.

Accordingly, the program operation on the corresponding memory block is completed. Memory cells corresponding to the other word lines WL30 to WL0 have not been programmed. Therefore, when an open block is selected in a subsequent program operation, a program operation may be performed on the memory cells corresponding to the other word lines WL30 to WL0. This will be described with reference to FIGS. 7A to 8B.

Referring to FIG. 5B, a memory block may include memory strings MS11 to MSmn, and m and n may be integers of 2 or more. In this embodiment, a program order when the memory block includes first to forty-eighth word lines WL0 to WL47 and first to one hundred and ninety-second pages, and m=4 will be described. The first to forty-eighth word lines WL0 to WL47 may be sequentially arranged at the same level, and one word line may correspond to one page. Alternatively, the first to forty-eighth word lines WL0 to WL47 may be sequentially stacked, and one word line may be coupled to a plurality of pages, e.g., four pages. The number of word lines included in one memory block may be variously modified.

The program order of a plurality of word lines may be sequential or random. For example, a program operation may be sequentially performed in one direction on the word lines WL0 to WL47 arranged in the one direction, or be randomly performed irrespectively to the arrangement order. Alternatively, a program operation may be sequentially performed on the stacked word lines WL0 to WL47 from the top to the bottom or from the bottom to the top, or be randomly performed irrespectively to the stacking order. In this embodiment, a case where a program operation is sequentially performed according to the arrangement order or stacking order of word lines will be described.

Referring to FIGS. 3 and 5B, a first program operation is performed on kth memory cells corresponding to a kth word line WL47 (S410). The first program operation may be performed on first to fourth pages P0 to P3 located at the same level. In an embodiment, the first program operation may be performed on first to fourth pages P0 to P3 coupled to the same word line (i.e., WL47).

Subsequently, the first program operation is performed on (k+1)th memory cells corresponding to a (k+1)th word line WL46 (S420). The first program operation may be performed on a plurality of pages corresponding to the (k+1)th word line WL46. For example, the first program operation may be performed on fifth to eighth pages P4 to P7 located at the same level. In an embodiment, the first program operation may be performed on fifth to eighth pages P4 to P7 coupled to the same word line (i.e., WL47).

Subsequently, a second program operation is performed on the kth memory cells corresponding to the kth word line WL47 (S430). The second program operation may be performed on the first to fourth pages P0 to P3 corresponding to the kth word line WL47. Program operations may be consecutively performed from the second program operation to the last program operation. For example, after the second program operation is performed on the first to fourth pages P0 to P3, a third program operation is performed on the first to fourth pages P0 to P3.

Subsequently, when the (k+1)th word line WL46 is not the closing word line (S440), the first program operation is performed on (k+2)th memory cells corresponding to a (k+2)th word line WL45 (S450 and S420). The first program operation may be performed on ninth to twelfth pages P8 to P11 corresponding to the (k+2)th word line WL45.

Subsequently, the second program operation is performed on the (k+1)th memory cells corresponding to the (k+1)th word line WL46 (S430). The program operations are consecutively performed on the fifth to eighth pages P4 to P7 from the second program operation to the last program operation. For example, after the second program operation is performed on the fifth to eighth pages P4 to P7, the third program operation is performed on the fifth to eighth pages P4 to P7.

"S420 to S450" are repeatedly performed until a corresponding word line becomes the closing word line. When the corresponding word line becomes the closing word line, a dummy program is performed. The first program operation is performed on (k+1)th memory cells corresponding to a (k+1)th word line WL41 (S420), and the second program operation is performed on kth memory cells corresponding to a kth word line WL42 (S430). Subsequently, when the (k+1)th word line WL41 is the closing word line (S440), the dummy program operation is performed on (k+2)th memory cells corresponding to a (k+2)th word line WL40 (S460). The dummy program operation may be performed on twenty-ninth to thirty-second pages P28 to P31 corresponding to the (k+2)th word line WL40. Subsequently, the second program operation is performed on the (k+1)th memory cells corresponding to the (k+1)th word line WL41 (S470). The program operation are consecutively performed on twenty-fifth to twenty-eighth pages P24 to P27 corresponding to the (k+1)th word line WL41 from the second program operation to the last program operation. For example, after the second program operation is performed on the twenty-fifth to twenty-eighth pages P24 to P27, the third program operation is performed on the twenty-fifth to twenty-eighth pages P24 to P27.

Accordingly, the program operation on the corresponding memory block is completed. Memory cells corresponding to the other word lines WL39 to WL0 have not been programmed. Therefore, when an open block is selected in a subsequent program operation, a program operation may be performed on the memory cells corresponding to the other word lines WL39 to WL0. This will be described with reference to FIGS. 7A to 8B.

Figures 6A, 6B:
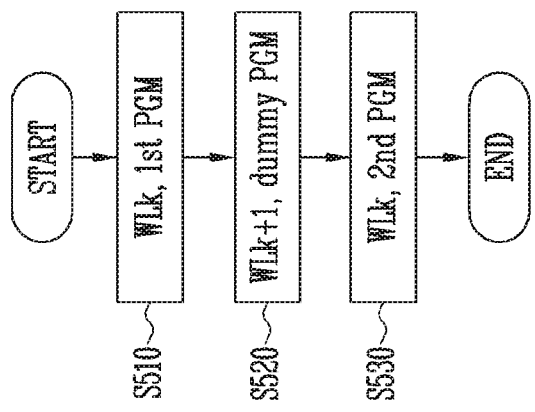
FIG. 6A is a flowchart illustrating an operating method of the semiconductor device according to an embodiment of the present disclosure.
FIG. 6B is a diagram illustrating a program order of word lines/pages included in one memory block.

FIG. 6A is a flowchart illustrating an operating method of the semiconductor device according to an embodiment of the present disclosure, and FIG. 6B is a diagram illustrating a program order of word lines/pages included in one memory block. Hereinafter, a case where a program operation on a corresponding memory block is completed after a program operation is performed on one word line of the corresponding memory block will be described.

Referring to FIG. 6A, a first program operation is performed on kth memory cells corresponding to a kth word line WLk (S510), Here, k is an integer of 1 or more. When the kth word line WLk is a closing word line, a dummy program operation is performed on (k+1)th memory cells corresponding to a (k+1)th word lines WLk+1 (S520). Subsequently, a second program operation is performed on the kth memory cells corresponding to the kth word line WL (S530). Accordingly, the program operation on the corresponding memory block is completed.

Referring to FIG. 6B, a memory block may include MS11 to MSmn, and m and n may be integers of 2 or more. In this embodiment, a program order when the memory block includes a plurality of word lines and a plurality of pages, m=4, and a case where the kth word line WLk is selected will be described.

Referring to FIGS. 6A and 6B, a first program operation is performed on the kth memory cells corresponding to the kth word line WLk (S510), The first program operation may be performed on first to fourth pages P0 to P3 corresponding to the kth word line WLk.

Subsequently, when the kth word line WLk is the closing word line of which program operation is completed, a dummy program operation is performed on the (k+1)th memory cells corresponding to the (k+1)th word line WLk+1 (S520). The dummy program operation may be performed on fifth to eighth pages P4 to P7 corresponding to the (k+1)th word line WLk+1.

Subsequently, a second program operation is performed on the kth memory cells corresponding to the kth word line WLk (S530). Accordingly, the program operation on the corresponding memory block is completed.

According to the above-described operating method, the dummy program operation is performed on a word line adjacent to the closing word line before the closing word line is programmed. In particular, even when the program operation is performed on only one word line WLk among a plurality of word lines included in a memory block, the dummy program operation is performed on an adjacent word line WLk+1 before the word line WLk is programmed. Thus, the threshold voltage distribution of memory cells corresponding to the closing word line can be improved, and retention characteristics can be ensured.

Figure 7A:
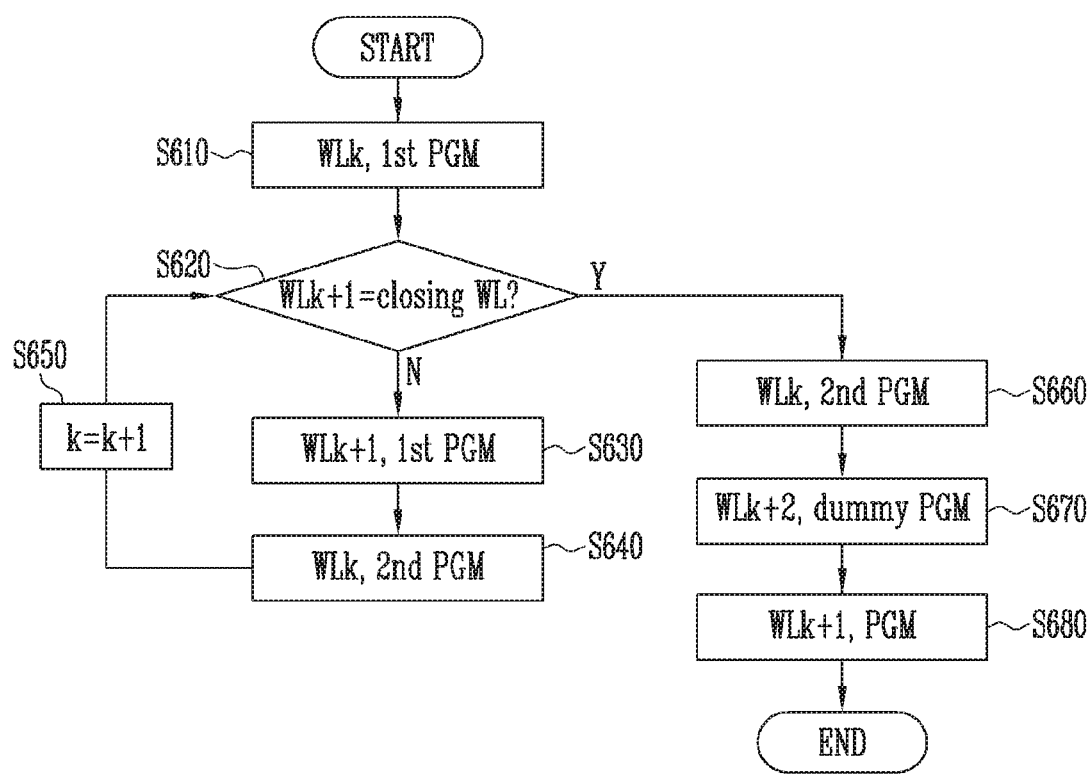
FIG. 7A is a flowchart illustrating an operating method of the semiconductor device according to an embodiment of the present disclosure.

FIG. 7A is a flowchart illustrating an operating method of the semiconductor device according to an embodiment of the present disclosure, and FIG. 7B is a diagram illustrating a program order of word lines/pages included in one memory block.

Referring to FIG. 7A, a first program operation is performed on kth memory cells corresponding to a kth word line WLk (S610). Subsequently, it is determined whether a (k+1)th word line WLk+1 is a closing word line (S620).

When the (k+1)th word line WLk+1 is not the closing word line (S620), the first program operation is performed on (k+1)th memory cells corresponding to the (k+1)th word line WLk+1 (S650 and S620). That is, "S620 to S650" are repeatedly performed until a corresponding word line becomes the closing word line.

When the (k+1)th word line WLk+1 is the closing word line (S620), a second program operation is performed on the kth memory cells corresponding to the kth word line WLk (S660). Subsequently, a dummy program operation is performed on (k+2)th memory cells corresponding to a (k+2)th word line WLk+2 (S670), and then a program operation is performed on the (k+1)th memory cells corresponding to the (k+1)th word line WLk+1 (S680). The program operation may include the first program operation and the second program operation. Accordingly, the program operation on a corresponding memory block is completed.

Referring to FIG. 7B, a memory block may include memory strings MS11 to MSmn, and m and n may be integers of 2 or more. In this embodiment, a program order when the memory block includes first to fortieth word lines WL0 to WL39 and first to one hundred and sixtieth pages, and m=4 will be described.

Referring to FIGS. 7A and 7B, a first program operation is performed on kth memory cells corresponding to a kth word line WL39 (S610). Subsequently, when a (k+1)th word line WL38 is not the closing word line (S620), the first program operation is performed on (k+1)th memory cells corresponding to the (k+1)th word line WL38 (S630). Subsequently, a second program operation is performed on the kth memory cells corresponding to the kth word line WL39 (S640), Subsequently, it is determined whether a (k+2)th word line WLk+2 is the closing word line (S620).

"S620 to S650" are repeatedly performed until a corresponding word line becomes the closing word line. When the corresponding word line becomes the closing word line, multi-step program operations of the previous word lines are completed, and then a dummy program operation is performed. When the (k+1)th word line WL32 is the closing word line (S620), the second program operation is performed on kth memory cells corresponding to a kth word line WL33 (S660), so that a program operation on the kth word line WL33 is completed. Subsequently, the dummy program operation is performed on (k+2)th memory cells corresponding to a (k+2)th word line WL31 (S670), and then the program operation is performed on (k+1)th memory cells corresponding to the (k+1)th word line WL32 (S680). The program operation may include the first program operation and the second program operation. Accordingly, the program operation on a corresponding memory block is completed.

Figures 8A, 8B:
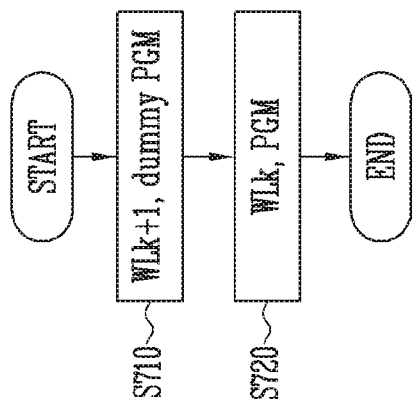
FIG. 8A is a flowchart illustrating an operating method of the semiconductor device according to an embodiment of the present disclosure.
FIG. 8B is a diagram illustrating a program order of word lines/pages included in one memory block.

FIG. 8A is a flowchart illustrating an operating method of the semiconductor device according to an embodiment of the present disclosure, and FIG. 8B is a diagram illustrating a program order of word lines/pages included in one memory block. Hereinafter, a case where a program operation on a corresponding memory block is completed after a program operation is performed on one word line of the corresponding memory block will be described.

Referring to FIG. 8A, when a kth word line WLk is a closing word line, a dummy program operation is performed on (k+1)th memory cells corresponding to a (k+1)th word line WLk+1 (S710). Subsequently, a program operation is performed on kth memory cells corresponding to the kth word line WLk (S730). The program operation may be a multi-step program operation. Accordingly, the program operation of the corresponding memory block is completed.

Referring to FIG. 8B, a memory block may include memory strings MS11 to MSmn, and m and n may be integers of 2 or more. In this embodiment, a program order when the memory block includes a plurality of word lines and a plurality of pages, m=4, and a case where the kth word line WLk is selected will be described.

Referring to FIGS. 8A and 8B, when the kth word line WLk is the closing word line, a dummy program operation is performed on the (k+1)th memory cells corresponding to the (k+1)th word line WLk+1 (S710). Subsequently, a program operation is performed on the kth memory cells corresponding to the kth word line WLk (S720). The program operation may include a first program operation and a second program operation. Accordingly, the program operation on the corresponding memory block is completed.

Figure 9A:
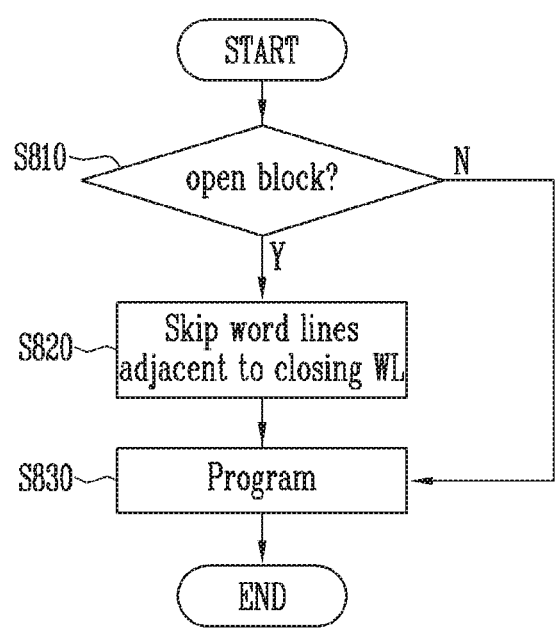
FIG. 9A is a flowchart illustrating an operating method of the semiconductor device according to an embodiment of the present disclosure.

FIG. 9A is a flowchart illustrating an operating method of the semiconductor device according to an embodiment of the present disclosure, and FIGS. 9B and 9C are diagrams illustrating a program state of word lines included in one memory block.

Referring to FIG. 9A, it is determined whether a selected memory block is an open block before a program operation is performed (S810). When it is determined that the selected memory block is not the open block, the program operation is performed (S830). For example, a selected memory block BLK may include a plurality of word lines WL1 to WLy, and y may be an integer of 3 or more. Per the determination result, when the plurality of word lines WL1 to WLy are all in a state in which they are not programmed, the program operation may be performed using the method described with reference to FIGS. 3 to 8B. In an embodiment, when the program operation for some pages among pages included in a memory block are completed and are not performed on other pages in the memory block, the corresponding memory block may be considered as an open block and thus the selected block is an open block (S810), at least one word line WLc+1 to WLk adjacent a closing word line WLc is skipped (S820). In an embodiment, when a program operation on all pages included in a memory block is completed, the corresponding memory block may be considered as a closed block and thus the program operation is performed (S830).

When it is determined that the selected memory block is the open block (S810), at least one word line WLc+1 to WLk adjacent a closing word line WLc is skipped (S820). Here, c may be an integer of 1 or more, and k may be an integer of 2 or more. Referring to FIG. 9B, the skipped word lines WLc+1 to WLk may be dummy-programmed word lines. Referring to FIG. 9C, the skipped word lines WLc+1 to WLk may be a dummy-programmed word line and unprogrammed word lines WLk+1 to WLk+s. A word line corresponding to memory cells on which the program operation or the dummy program operation is not performed may be the unprogrammed word line.

Subsequently, referring to FIG. 9B, a program operation is performed on the other word lines WLk+1 to WLy (S830). Referring to FIG. 9C, a program operation is performed on the other word lines WLk+s+1 to WLy (S830). Here, y is an integer of 3 or more. The program operation may be performed using the method described with reference to FIGS. 3 to 8B.

According to the above-described operating method, skipped word lines exist between the closing word line WLc to which real data is programmed and the word line WLk+1 on which the program operation is to be performed. Also, the skipped word lines may include dummy-programmed word lines WLc+1 to WLk, or include a dummy-programmed word line and unprogrammed word lines WLk+1 to WLk+s. Thus, when a program operation is performed on an open block, coupling/interference applied to the closing word line WLc can be minimized. Further, the threshold voltage fluctuation of memory cells corresponding to the closing word line WLc can be minimized.

Figure 10:
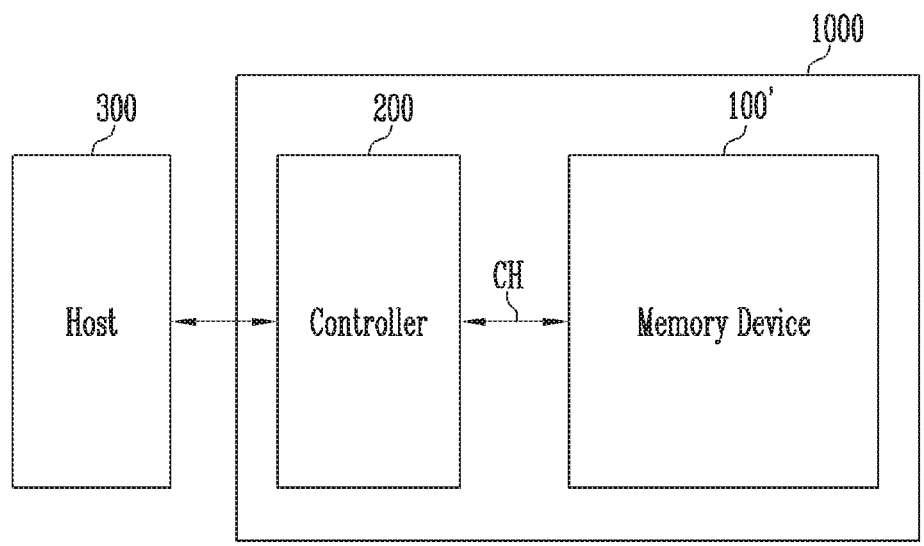
FIG. 10 is a block diagram illustrating a configuration of a memory system according to an embodiment of the present disclosure.

FIG. 10 is a block diagram illustrating a configuration of a memory system according to an embodiment of the present disclosure.

Referring to FIG. 10, the memory system 1000 includes a memory device 100' and a controller 200.

The controller 200 controls the memory device 100' through a channel CH, and the memory device 100' operates under the control of the controller 200. The memory device 100' includes a memory cell array having a plurality of memory blocks. In an embodiment, the memory device 100' may be one or more of the semiconductor devices 100 described above. In an embodiment, the memory device 100' may be the one or more semiconductor devices 100 described above, and be a flash memory device.

The controller 200 controls the memory device 100' in response to a request from a host 300. In addition, the memory device 100' receives a command and an address from the controller 200 through the channel CH, and accesses an area selected by the address in the memory cell array. That is, the memory device 100' performs an internal operation corresponding to the command on the area selected by the address.

Also, the controller 200 may control the memory device 100' to perform a program operation, a read operation, an erase operation, or the like. In the program operation, the controller 200 provides the memory device 100' with a program command, an address, data, and the like through the channel CH, and the memory device 100' programs the data in an area selected by the address. In the erase operation, the controller 200 provides the memory device 100' with an erase command, an address, and the like through the channel CH, and the memory device 100' erase data stored in an area selected by the address. In the read operation, the controller 200 provides the memory device 100' with a read command, an address, and the like through the channel CH, and the memory device 100' reads data from an area selected by the address. The read operation includes not only a read operation for reading and outputting data stored in a memory cell but also a read operation as a verify operation accompanied by the program or erase operation.

When a program operation is performed, the controller 200 may efficiently manage an open block, and efficiently manage coupling/interference applied to a previously programmed word line in the program operation on the open block. For example, when a write operation is requested from the host 300, the controller 200 commands the memory device 100' to perform a program operation such that the program operation is performed using one or more of the methods described with reference to FIGS. 3 to 9B.

For example, the controller 200 provides the memory device 100' with information on a closing word line together with a program command, an address, data, and the like. Therefore, the controller 200 may control the memory device 100' to dummy-program memory cells corresponding to word lines adjacent to the closing word line and then program the closing word line. In a program operation on an open block, the controller 200 may control the memory device 100' to skip a word line adjacent to the closing word line or the dummy-programmed word line and perform a program operation on the other open word lines.

According to the above-described methods, the threshold voltage distribution of memory cells corresponding to the closing word line can be improved, and the reliability of data programmed in the memory cells corresponding to the closing word line can be ensured.

Figure 11:
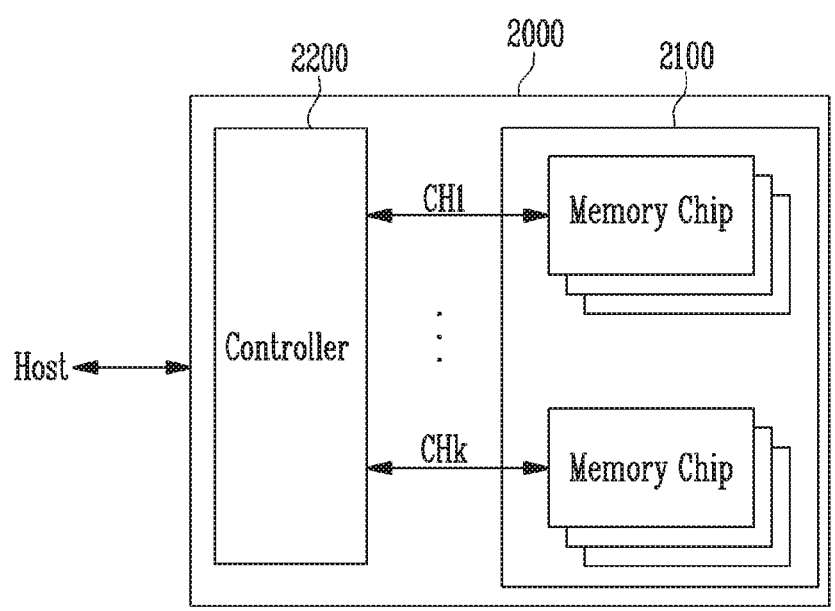
FIG. 11 is a block diagram illustrating a configuration of a memory system according to an embodiment of the present disclosure.

FIG. 11 is a block diagram illustrating a configuration of a memory system according to an embodiment of the present disclosure.

Referring to FIG. 11, the memory system 2000 includes a memory device 2100 and a controller 2200.

The memory device 2100 may be a semiconductor device, and include a plurality of memory chips. The plurality of memory chips are divided into a plurality of groups. The plurality of groups communicate with the controller 2200 respectively through first to kth channels CH1 to CHk. Each memory chip may be configured and operated similarly to the one or more semiconductor devices 100 described with reference to FIG. 1.

Each group communicates with the controller 2200 through one common channel. The controller 2200 is configured identically to the controller 200 described with reference to FIG. 10. The controller 2200 controls the plurality of memory chips of the memory device 2100 through the plurality of channels CH1 to CHk. The memory system 2000 may be modified such that one memory chip is coupled to one channel.

The controller 2200 and the memory device 2100 may be integrated into a single semiconductor device. In an embodiment, the controller 2200 and the memory device 2100 may be integrated into a single semiconductor device to constitute a memory card. For example, the controller 2200 and the memory device 2100 may be integrated into a single semiconductor device to constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

The controller 2200 and the memory device 2100 may be integrated into one semiconductor device to constitute a semiconductor drive (solid state drive (SSD)). The semiconductor drive SSD includes a storage device configured to store data in a semiconductor memory. When the memory system 2000 is used as the semiconductor drive SSD, the operating speed of a host Host coupled to the memory system 2000 can be remarkably improved.

In another example, the memory system 2000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

Figure 12:
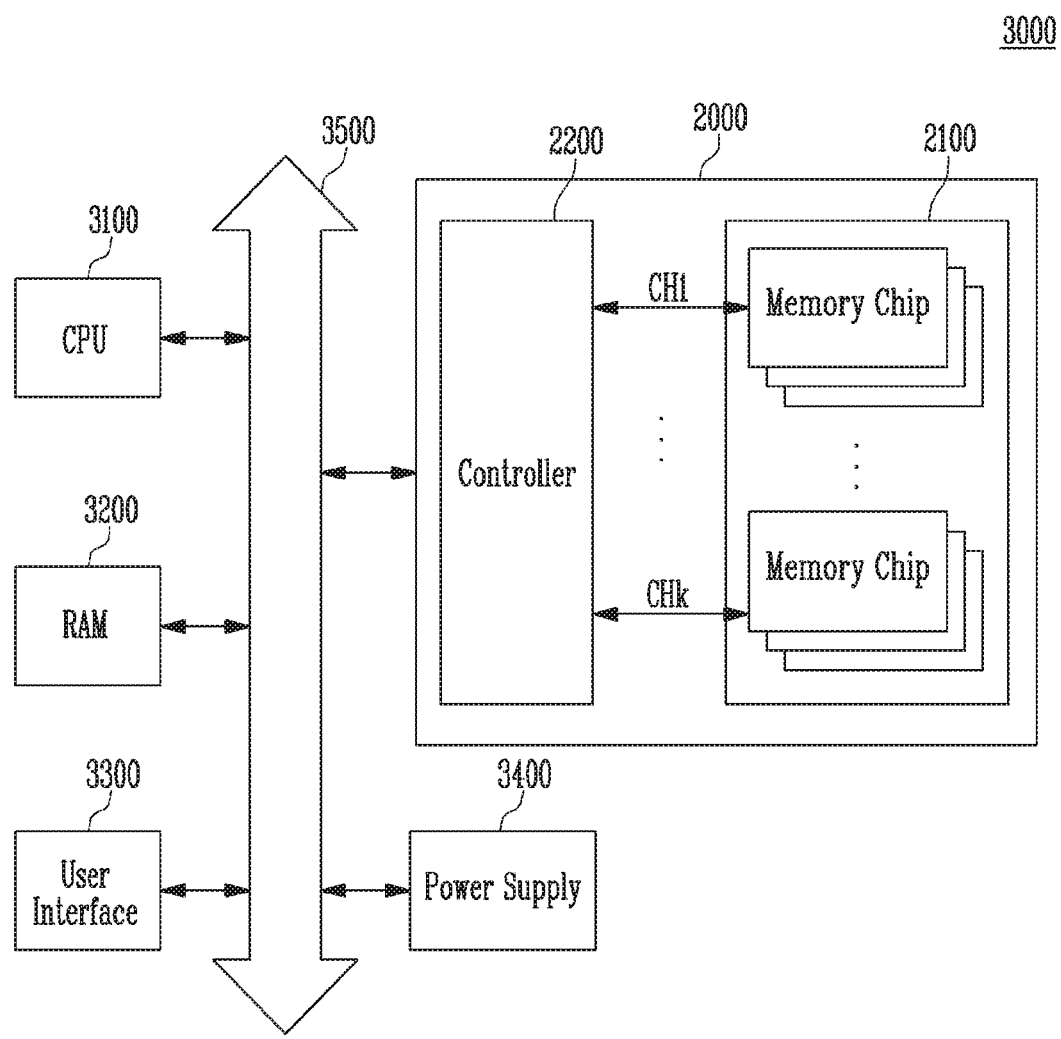
FIG. 12 is a block diagram illustrating a configuration of a computing system according to an embodiment of the present disclosure.

FIG. 12 is a block diagram illustrating a configuration of a computing system according to an embodiment of the present disclosure.

Referring to FIG. 12, the computing system 3000 includes a central processing unit 3100, a RAM 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

A memory device 2100 is coupled to the system bus 3500 through a controller 2200. When the memory device 2100 is directly coupled to the system bus 3500, the function of the controller 2200 may be performed by the central processing unit 3100 and the RAM 3200.

The computing system 3000 may be configured to include the memory system 2000 described with reference to FIG. 11 or to include the memory system 1000 described with reference to FIG. 10. In addition, the computing system 3000 may be configured to include both the memory systems 1000 and 2000 described with reference to FIGS. 10 and 11.

According to the present disclosure, program disturb can be reduced, and data retention characteristics can be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a memory block including a first word line, a third word line, and a second word line stacked between the first word line and the third word line; and
   a control logic configured to program first memory cells corresponding to the first word line, identify that the second word line is a closing word line, perform a dummy program operation on third memory cells corresponding to the third word line, and perform a program operation on second memory cells corresponding to the closing word line after the dummy program operation is performed.

2. A method for operating a semiconductor device, the method comprising:
performing a first program operation on first memory cells corresponding to a first word line;
performing the first program operation on second memory cells corresponding to a second word line next to the first word line;
performing a second program operation on the first memory cells;
performing a dummy program operation on third memory cells corresponding to a third word line next to the second word line; and
performing the second program operation on the second memory cells;
selecting an open block on which the second program operation is performed; and
skipping at least one unprogrammed word line next to the third word line, and performing a program operation on other word lines of the open block.

3. The method of claim 2, wherein the first program operation is performed on the second memory cells before the dummy program operation is performed.

4. The method of claim 2, wherein the second program operation is performed on the second memory cells after the dummy program operation is performed.

5. The method of claim 2, wherein the first to third word lines are consecutively located.

6. The method of claim 2, wherein the second word line is stacked between the first word line and the third word line, and a program operation is sequentially performed to the first to third word lines.

7. The method of claim 2, wherein the second word line is a closing word line.

8. A method for operating a semiconductor device including a memory block including a plurality of word lines, the method comprising:
identifying that a word line next to a selected word line, among the plurality of word lines, is a closing word line;
performing a dummy program operation on memory cells corresponding to a word line next to the closing word line;
after the dummy program operation is performed, performing a first program operation on memory cells corresponding to the closing word line;
selecting an open block on which the dummy program operation and the first program operation are performed; and
skipping at least one word line next to the closing word line, and performing a second program operation on other word lines of the open block.

9. The method of claim 8, further comprising, before identifying that the word line is the closing word line, programming memory cells corresponding to the selected word line.

10. The method of claim 8, wherein the skipped word line includes a dummy-programmed word line.

11. The method of claim 8, wherein the skipped word line includes a dummy-programmed word line and an unprogrammed word line.

* * * * *